(12) United States Patent
Arkhipov et al.

(10) Patent No.: US 7,079,748 B2
(45) Date of Patent: Jul. 18, 2006

(54) INTEGRATED OPTICAL DEVICE AND METHOD OF MAKING THE SAME

(75) Inventors: Vladimir Arkhipov, Leuven (BE); Paul Heremans, Leuven (BE)

(73) Assignee: Interuniveristair Microelekktronica Centrum (IMEC), Leuven (BE)

( * ) Notice: Subject to any disclaimer, the term of this patent is extended or adjusted under 35 U.S.C. 154(b) by 74 days.

(21) Appl. No.: 10/753,091

(22) Filed: Jan. 7, 2004

(65) Prior Publication Data
US 2004/0170371 A1 Sep. 2, 2004

Related U.S. Application Data

(60) Provisional application No. 60/439,603, filed on Jan. 10, 2003.

(30) Foreign Application Priority Data
Jan. 10, 2003 (EP) .................... 03447004

(51) Int. Cl.
*G02B 6/00* (2006.01)
*H01S 3/30* (2006.01)

(52) U.S. Cl. ............ 385/141; 385/142; 385/143; 372/6

(58) Field of Classification Search ........ 385/141–143; 372/6
See application file for complete search history.

(56) References Cited

U.S. PATENT DOCUMENTS

| 5,892,876 | A | * | 4/1999 | Desurvire et al. ........... 385/123 |
| 6,091,085 | A | * | 7/2000 | Lester ........................ 257/98 |
| 6,167,075 | A | | 12/2000 | Craig et al. |
| 6,297,495 | B1 | * | 10/2001 | Bulovic et al. .......... 250/214.1 |
| 6,324,326 | B1 | * | 11/2001 | Dejneka et al. ............. 385/123 |
| 6,538,375 | B1 | * | 3/2003 | Duggal et al. ............. 313/506 |
| 2003/0016930 | A1 | * | 1/2003 | Inditsky ...................... 385/133 |

FOREIGN PATENT DOCUMENTS

| DE | 100 54 552 A1 | 5/2002 |
| EP | 0 989 639 A2 | 3/2000 |
| EP | 1 180 805 A2 | 2/2002 |
| JP | 2001-78961 | 3/2001 |

OTHER PUBLICATIONS

European Search Report dated Mar. 11, 2003, for European Application No. 03447004.7.

* cited by examiner

*Primary Examiner*—Brian Healy
*Assistant Examiner*—Jerry Martin Blevins
(74) *Attorney, Agent, or Firm*—Knobbe Martens Olson & Bear LLP

(57) ABSTRACT

An optical fiber and method of making the same, the optical fiber being characterized by an axial symmetry and comprising a core, doped with phosphorescent or fluorescent impurities, and a transparent envelope. The transparent envelope comprises a cladding layer and optionally a jacket layer surrounding the cladding layer. The optical fiber may further comprise an associated light source comprising an inner electrode, an outer electrode, and an active area, located between said inner electrode and said outer electrode. The light source and said optical fiber are integrated as a unit. The light source is characterized by an axial symmetry and is positioned coaxial with respect to the axis of the optical fiber. The inner electrode is substantially transparent, such that light generated in said active area may propagate outside said light source and into the optical fiber.

48 Claims, 2 Drawing Sheets

INTEGRATED OPTICAL DEVICE AND METHOD OF MAKING THE SAME

RELATED APPLICATIONS

This application claims priority to, and hereby incorporates the entire disclosure of, co-pending U.S. Provisional Application No. 60/439,603, entitled "OPTICAL DEVICE", and filed on Jan. 10, 2003.

BACKGROUND OF THE INVENTION

1. Field of the Invention

The present invention is related to the fields of fiber optics and flexible, preferably organic, light-emitting diodes.

2. Description of the Related Art

The use of optical coupling components is typically required to couple light produced by a Lambertian light source to an optical fiber, because the optical fiber has a limited numerical aperture. An example of a Lambertian light source is a Light Emitting Diode (LED). An example of a method for coupling light produced by a light-source (LED) into a fiber is disclosed in Japanese Application No. JP-2001078961, which is incorporated in its entirety herein by reference. In the '961 application, light originating from different LEDs is coupled into an optical fiber using focusing means. In German Patent No. DE10054552, which is also incorporated herein by reference in its entirety, light produced by a LED is coupled to an optical fiber by using an optical lens. There is a need in this field of technology to provide an integrated optical device in which no optical coupling components are necessary.

SUMMARY OF THE INVENTION

The present invention aims to provide an integrated optical device, comprising an optical fiber pumped by an integrated flexible light source positioned substantially coaxially with respect to the optical fiber, wherein optical coupling devices are not necessarily required for coupling. In one embodiment, the optical device comprises an optical fiber having a substantially axial symmetry, the optical fiber comprising a transparent envelope surrounding a core doped with phosphorescent or fluorescent material, said transparent envelope comprising a cladding layer. The optical device further comprises a light source comprising an inner electrode, an outer electrode, and an active area located between said inner electrode and said outer electrode. The light source and said optical fiber are integrated, and said light source has an axial symmetry and is positioned coaxially with respect to the axis of said optical fiber. The inner electrode comprises a transparent material to permit light generated in said active area to propagate outside said light source and into said optical fiber.

In another embodiment the invention provides a method of making an optical device. The method comprises forming an optical fiber having an axial symmetry. The method further comprises surrounding a fiber core of the optical fiber with a transparent envelope, the fiber core being doped with phosphorescent or fluorescent material, wherein said transparent envelope comprises a cladding layer. The method further comprises integrating a light source with the optical fiber, the light source comprising an inner electrode, an outer electrode, and an active area located between said inner electrode and said outer electrode. The method further comprises positioning the light source coaxially with respect to the axis of said optical fiber, wherein said inner electrode comprises a transparent material to permit light generated in said active area to propagate outside said light source and into said optical fiber.

It is an aim of the invention to provide an integrated optical device wherein an optical fiber is pumped with a coaxial organic light-emitting diode.

It is a further aim of the invention to provide an integrated optical device that may be used to generate optical signals.

It is a further aim of the invention to provide an integrated optical device that may be used to amplify or regenerate optical signals (also called repeater).

It is a further aim of the invention to provide an integrated optical device that, at higher excitation intensities, represents a fiber laser.

It is a further aim of the invention to provide an integrated optical device, comprising optical fiber and light source that may be manufactured in the same technological process.

It is a further aim of the invention to provide an integrated optical device, which may be used for introscopic, for instance endoscopic, purposes.

In another embodiment, the optical device comprises:

an optical fiber, having an axial symmetry, comprising a core, doped with phosphorescent or fluorescent impurities, and a transparent envelope;

said transparent envelope further comprising a cladding layer and optionally a jacket layer, surrounding said cladding layer;

an associated light source, comprising:

an inner electrode, an outer electrode, and an active area, located between said inner electrode and said outer electrode;

wherein said light source and said optical fiber are integrated, said light source has an axial symmetry and is positioned coaxially to said optical fiber, and said inner electrode is transparent, such that light, generated in said active area may propagate outside said light source and into said optical fiber.

Advantageously, said outer electrode is reflective.

Advantageously, said light-source is flexible, and may be a mono- or multi-layer organic light-emitting diode (OLED).

According to a first embodiment, said outer electrode is transparent and said light-source comprises an additional outer layer which is reflective.

Advantageously, the device according to the invention further comprises mirrors on both sides of the optically pumped region, one mirror being not transparent, the other mirror being partially transparent. Advantageously, said device is a laser.

Preferably, the efficiency of absorption of light in said core, said light produced by said light source, is a function of Pe/Pc, and advantageously, said efficiency is controlled by choosing Pe/Pc appropriately.

The device according to the invention may be used as an optical signal generator, and advantageously, said optical signal is substantially constant.

The device according to the invention may also be used as an optical signal amplifier or repeater.

The device according to the invention may be used for introspection or endoscopy.

DETAILED DESCRIPTION OF THE PREFERRED EMBODIMENT

Figure 1:
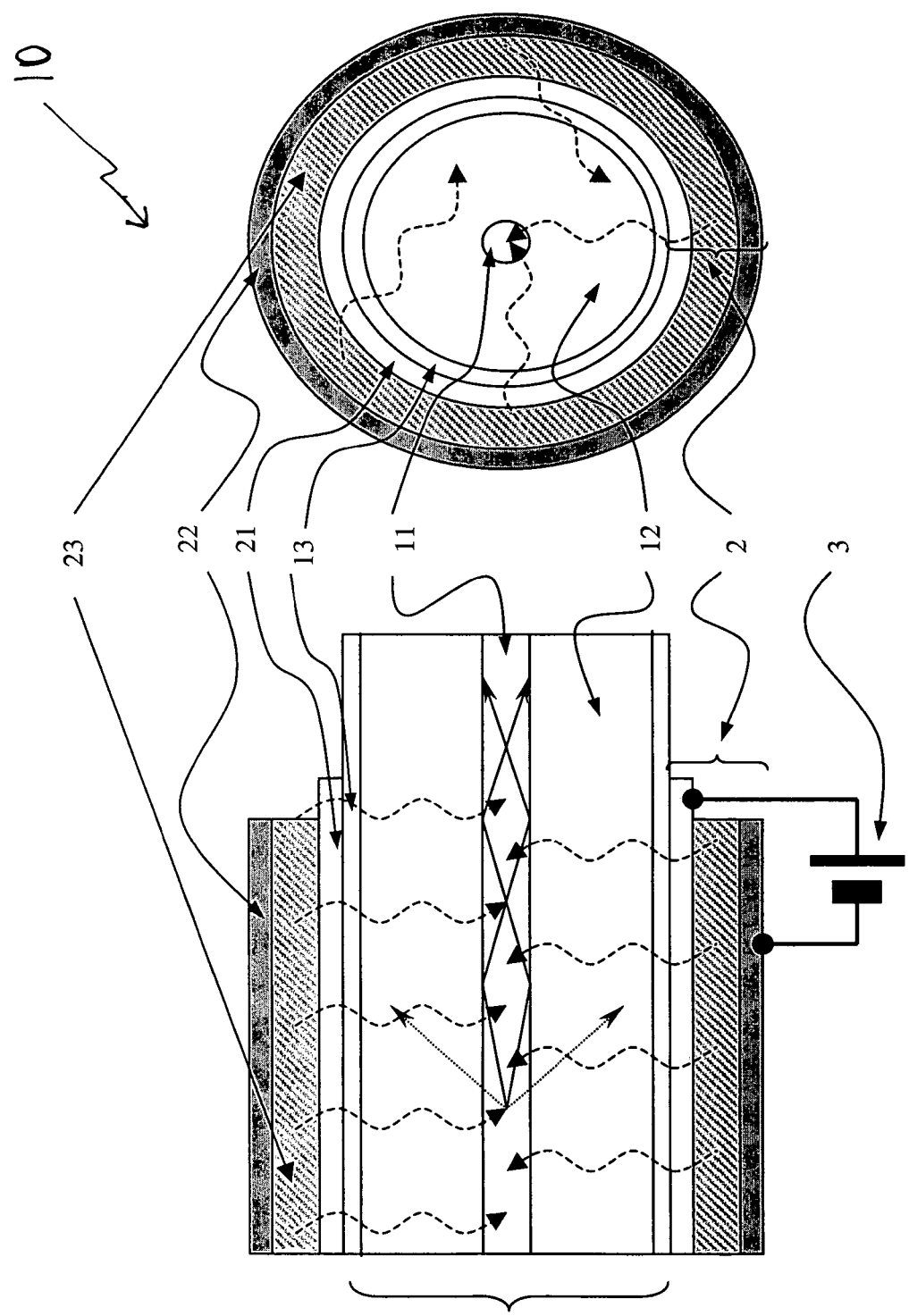
FIG. 1 shows axial and radial cross sections of an optical device in accordance with a first embodiment of the invention.

FIG. 1 shows an optical device 10 in accordance with a first embodiment of the invention. The optical device 10 comprises an optical fiber or fiber 1 and associated structures 2 and 3. The optical device 10 comprises a co-axial flexible light-emitting diode 2 (LED) to pump the optical fiber 1. The fiber 1 comprises a fiber core 11 embedded into a substantially transparent envelope comprising a cladding layer 12 and a transparent jacket layer 13. The transparent envelope is coated with, for example, a coaxial organic light-emitting diode (OLED) 2 comprising a transparent inner electrode 21, an active area 23, a reflecting metallic outer electrode 22, and a power supply 3. The fiber 1 may comprise a plastic optical fiber, a glass fiber, or another type of optical fiber suitable for the transmission of light. Optical fibers are generally flexible. The optical fiber or fiber 1 comprises an organic or inorganic core 11 doped with either fluorescent or phosphorescent impurities, referred to as dyes (preferably organic dyes or metals, preferably rare earth metals like Erbium, Terbium, Europium, etc.) and located in transparent envelope 12 and 13. The envelope comprises a cladding layer 12 and optionally an additional jacket layer 13, which constitutes a portion of the envelope and is thus transparent. The jacket layer 13 may improve the adhesion between the envelope and the flexible light emitting diode and may increase mechanical strength of the fiber 1.

In a first aspect of the first embodiment of the present invention, the envelope is coated with a coaxial mono- or multi-layer organic light-emitting diode (OLED) 2. OLEDs have three prominent features namely (i) easy production of OLEDs with large active areas, (ii) possibility of producing non-planar light-emitting surfaces, and (iii) flexibility of OLEDs comparable with or even exceeding that of optical fibers. Such unique combination of properties allows the integration of the OLED substantially coaxially with respect to the optical fiber 1 as described herein. According to one embodiment of the invention, the OLED 2 comprises a transparent inner electrode 21 (e.g., Indium Tin Oxide (ITO)). The OLED 2 further comprises a reflective, preferably metallic (e.g., Al, Ca, Ag, Au, . . . ), outer electrode 22. The active area 23 may comprise a mono layer or a multi layer structure. The active layer(s) may be made of organic materials such as, for example, conjugated polymers including polyphenylenevinylene (PPV) and derivatives thereof. The active layer(s) may also be made of small organic molecules as for instance $Alq_3$.

As further shown in FIG. 1, light emitted by the OLED 2 may penetrate the optically passive transparent inner electrode 21 and envelope 12 and 13, and may excite dye molecules in the core 11 of the optical fiber 1. Light that does not pass through the fiber core 11 traverses the envelope 12 and 13 and the OLED stack of layers until it may be reflected by the outer reflecting electrode 22 of the OLED. Due to a shift known as "Stokes shift", the emitted light may not be absorbed strongly in the active area 23 of the OLED 2. As is well known in the art, Stokes shift generally refers to a difference (usually in frequency units) between spectral positions of the band maxima (or the band origin) of the absorption and luminescence arising from the same electronic transition. Also, the envelope 12 and 13 is substantially transparent to the light. Therefore, light may undergo multiple reflections before the light ultimately penetrates into or reaches the fiber core 11. These multiple reflections enhance the light flux that finally penetrates into the fiber core 11 when compared to the light flux emitted by the surface of the OLED 2 along the direction of the fiber core 11. Light emitted by the OLED may be advantageously chosen to lie in the absorption band of dye dopants that are incorporated in the fiber core 11. Within the fiber core 11, the OLED-pumped light therefore excites said dye dopants that subsequently emit photons along various directions. A fraction of the light emitted by said dopants will be wave-guided within the optical fiber 1.

At low excitation intensities, at least a portion of the light waves emitted by dopants via spontaneous fluorescence or phosphorescence will satisfy the condition of full internal reflectance at the boundary between the core 11 and cladding layer 12 and will be guided along the fiber.

Enhanced emission causes stimulated emission in the fiber core 11. As described below, the optical device is integrated for use in optical signal generation, regeneration and amplification. As may be understood by those skilled in the art, the "integrated" generally refers to the device that is unified as a single functional unit.

Figure 2:
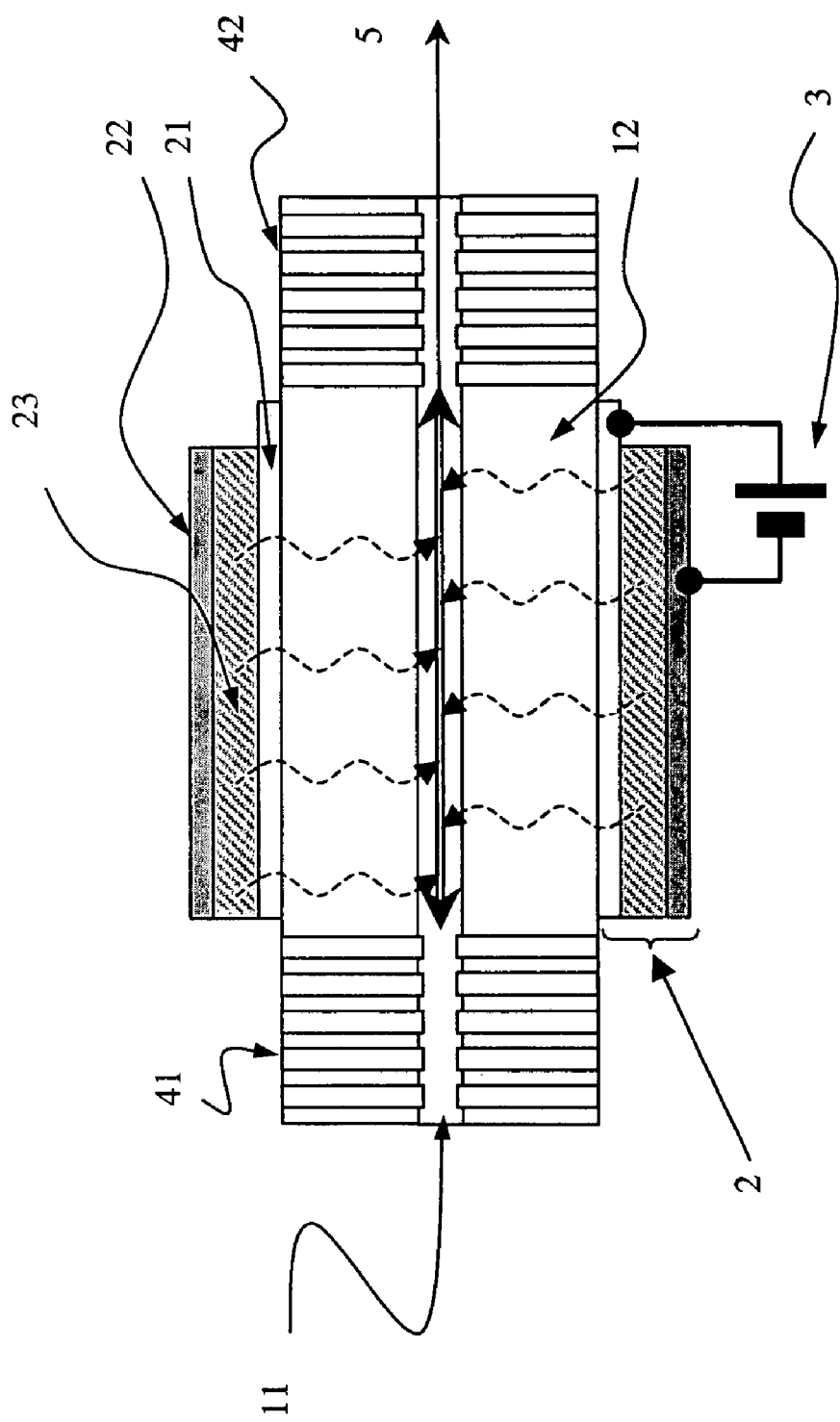
FIG. 2 shows an axial cross section of an optical device in accordance with a second embodiment of the invention.

In a second embodiment of the invention, FIG. 2 shows an optical fiber 1 comprising mirrors 41 and 42 placed at both ends of the pumped fiber region. The mirrors 41 and 42 may be formed by technologies known to a person skilled in the art, for example by etching a pair of fiber phase gratings into the core 11 of the fiber that act like Bragg gratings or by depositing a reflective material on cleaved fiber ends. At least one of the mirrors 41 and 42 may be partially transparent, e.g., the mirror 42. As the intensity of the light absorbed in the fiber core 11 reaches a threshold level for stimulated emission to occur, optical gain may be provided into the cavity formed between the mirrors 41 and 42. The threshold level may be reached at higher light fluxes generated by the OLED 2. Lasing (e.g., generating a laser or coherent light from) output 5 may then be achieved in the OLED-pumped doped fiber 1.

In the first and second embodiments of the invention, the ratio of maximum pumping light flux that finally penetrates into the fiber core to the light flux emitted by the OLED surface (called efficiency) may be modeled as a function of the ratio of the perimeter of the envelope 12 and 13 to the perimeter of the core 11, i.e., Pe/Pc. This ratio may be designed to be one or several orders of magnitude by varying the radii of the core (Rc) and the envelope (Re). Thus, one of the advantages provided by the invention is the ability to allow to control the amount of flux of light absorbed in the fiber core 11.

Another aspect of the invention is that theoretically some light rays of the pumping OLED may resonate in a mode that does not traverse the core of the fiber. The presence of such modes may be maximally avoided, resulting in a further increased light flux of pumping light in the fiber core. In order to avoid the presence of modes that do not cross the fiber core, imperfections in the coaxial arrangement of the OLED with respect to the fiber core may be introduced. In practice such imperfection, although small, are always present. These imperfections may also be created on purpose, by for instance roughening the outer surface of the envelope before deposition of the OLED, or by roughening at least one layer that is a part of the integrated optical device, before adding the next layer(s). In those cases, the surface structure of the outer reflecting layer changes the angle of propagation at every reflection.

Yet another aspect of the invention, the OLED 2 comprises a transparent outer electrode and comprises an additional outer layer on top of the outer electrode, which is reflective. Light produced by the OLED may then pass through the transparent outer electrode and reflect from this additional reflective outer layer. The light-source may increase mechanical strength of the optical fiber.

The optical devices may be produced by rotating the optical fiber while adding deposition material onto the fiber in a controlled manner such that formation of homogeneous layers is achieved. Such optical devices may be used for introscopic applications, such as endoscopic purposes. Such applications aid in visualizing the interior of an object.

In view of the foregoing, it will be appreciated that the present system and method overcome the longstanding need in the industry for an integrated optical device without the necessity of a coupling optical component. The invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

The invention claimed is:

1. An optical device comprising a plurality of layers, the optical device comprising:
    an optical fiber having a substantially axial symmetry, the optical fiber comprising a transparent envelope surrounding a core doped with phosphorescent or fluorescent material, said transparent envelope comprising a cladding layer; and
    a light source comprising an inner electrode layer, a reflective outer electrode layer, and an active area layer located between said inner electrode and said outer electrode, wherein said light source and said optical fiber are integrated, and wherein said light source has an axial symmetry and is positioned coaxially with respect to the axis of said optical fiber, and wherein said inner electrode comprises a transparent material to permit light generated in said active area to propagate outside said light source and into said optical fiber,
    wherein at least one of the layers has imperfections whereby the imperfections act to increase the optical coupling efficiency into the optical fiber.

2. The device according to claim 1, wherein the envelope further comprises a jacket layer surrounding said cladding layer.

3. The device according to claim 1, wherein said light-source is flexible.

4. The device according to claim 1, wherein said light-source comprises a mono- or multi-layer organic light-emitting diode (OLED).

5. The device according to claim 1, further comprising at least one mirror on each side of an optically pumped region of the optical fiber, wherein one mirror is substantially opaque and the another mirror is at least partially transparent.

6. The device according to claim 1, wherein the efficiency of absorption of light in said core, said light produced by said light source, is a function of Pe/Pc.

7. The device according to claim 1, wherein the efficiency is controlled by choosing a desirable ratio of Pe/Pc.

8. The device according to claim 1, wherein the device is configured to generate optical signals.

9. The device according to claim 8, wherein said optical signal is substantially constant.

10. The device according to claim 1, wherein the device is configured to amplify or repeat optical signals.

11. The device according to claim 5, wherein said device is configured as a laser generator.

12. The device according to claim 1, wherein said device is configured for introspection.

13. The device according to claim 1, wherein said device is configured for endoscopy.

14. The device according to claim 1, wherein said imperfections are created by roughening said layer.

15. A method of making an optical device, the method comprising:
    forming an optical fiber having an axial symmetry;
    surrounding a fiber core of the optical fiber with a transparent envelope, the fiber core being doped with phosphorescent or fluorescent material, wherein said transparent envelope comprises a cladding layer;
    integrating a light source with the optical fiber, the light source comprising an inner electrode layer, a reflective outer electrode layer, and an active area layer located between said inner electrode and said outer electrode; and
    positioning the light source coaxially with respect to the axis of said optical fiber, wherein said inner electrode comprises a transparent material to permit light generated in said active area to propagate outside said light source and into said optical fiber,
    wherein at least one of the layers has imperfections whereby the imperfections act to increase the optical coupling efficiency into the optical fiber.

16. The method according to claim 15, further comprising surrounding said cladding layer with a jacket layer.

17. The method according to claim 15, wherein said light-source is flexible.

18. The method according to claim 15, wherein said light-source comprises a mono- or multi-layer organic light-emitting diode (OLED).

19. The method according to claim 15, further comprising positioning at least one mirror on each side of an optically pumped region of the optical fiber, wherein one mirror is substantially opaque and the another mirror is at least partially transparent.

20. The method according to claim 15, further comprising generating optical signals from the light source.

21. The method according to claim 15, further comprising generating substantially constant optical signals from the light source.

22. The method according to claim 15, further comprising performing at least one of amplification and repeating of optical signals.

23. The method according to claim 15, further comprising generating a laser light signal through the optical fiber.

24. The method according to claim 15, further comprising roughening at least one of the layers to obtain said imperfections.

25. A method of making an optical device, the method comprising:
    forming an optical fiber having an axial symmetry;
    surrounding a fiber core of the optical fiber with a transparent envelope, the fiber core being doped with phosphorescent or fluorescent material, wherein said transparent envelope comprises a cladding layer;

integrating a light source with the optical fiber, the light source comprising an inner electrode layer, a transparent outer electrode layer, an active area layer located between said inner electrode and said outer electrode, and a reflective layer on top of said outer electrode; and positioning the light source coaxially with respect to the axis of said optical fiber, wherein said inner electrode comprises a transparent material to permit light generated in said active area to propagate outside said light source and into said optical fiber, wherein at least one of the layers has imperfections whereby the imperfections act to increase the optical coupling efficiency into the optical fiber.

26. The method according to claim 25, further comprising surrounding said cladding layer with a jacket layer.

27. The method according to claim 25, wherein said light-source is flexible.

28. The method according to claim 25, wherein said light-source comprises a mono- or multi-layer organic light-emitting diode (OLED).

29. The method according to claim 25, further comprising positioning at least one mirror on each side of an optically pumped region of the optical fiber, wherein one mirror is substantially opaque and the another mirror is at least partially transparent.

30. The method according to claim 25, further comprising generating optical signals from the light source.

31. The method according to claim 25, further comprising generating substantially constant optical signals from the light source.

32. The method according to claim 25, further comprising performing at least one of amplification and repeating of optical signals.

33. The method according to claim 25, further comprising generating a laser light signal through the optical fiber.

34. The method according to claim 25, further comprising roughening at least one of the layers to obtain said imperfections.

35. An optical device comprising a plurality of layers, the optical device comprising:

an optical fiber having a substantially axial symmetry, the optical fiber comprising a transparent envelope surrounding a core doped with phosphorescent or fluorescent material, said transparent envelope comprising a cladding layer; and a light source comprising an inner electrode layer, a transparent outer electrode layer, an active area layer located between said inner electrode and said outer electrode, and a reflective layer on top of said outer electrode, wherein said light source and said optical fiber are integrated, and wherein said light source has an axial symmetry and is positioned coaxially with respect to the axis of said optical fiber, and wherein said inner electrode comprises a transparent material to permit light generated in said active area to propagate outside said light source and into said optical fiber, wherein at least one of the layers has imperfections whereby the imperfections act to increase the optical coupling efficiency into the optical fiber.

36. The device according to claim 35, wherein the envelope further comprises a jacket layer surrounding said cladding layer.

37. The device according to claim 35, wherein said light-source is flexible.

38. The device according to claim 35, wherein said light-source comprises a mono- or multi-layer organic light-emitting diode (OLED).

39. The device according to claim 35, further comprising at least one mirror on each side of an optically pumped region of the optical fiber, wherein one mirror is substantially opaque and the another mirror is at least partially transparent.

40. The device according to claim 35, wherein the efficiency of absorption of light in said core, said light produced by said light source, is a function of Pe/Pc.

41. The device according to claim 35, wherein the efficiency is controlled by choosing a desirable ratio of Pe/Pc.

42. The device according to claim 35, wherein the device is configured to generate optical signals.

43. The device according to claim 42, wherein said optical signal is substantially constant.

44. The device according to claim 35, wherein the device is configured to amplify or repeat optical signals.

45. The device according to claim 39, wherein said device is configured as a laser generator.

46. The device according to claim 35, wherein said device is configured for introspection.

47. The device according to claim 35, wherein said device is configured for endoscopy.

48. The device according to claim 35, wherein said imperfections are created by roughening said layer.

* * * * *